United States Patent
Wakabayashi

(10) Patent No.: US 9,653,299 B2
(45) Date of Patent: May 16, 2017

(54) SEMICONDUCTOR DEVICE PRODUCING METHOD

(71) Applicant: SUMITOMO HEAVY INDUSTRIES, LTD., Tokyo (JP)

(72) Inventor: Naoki Wakabayashi, Yokosuka (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 93 days.

(21) Appl. No.: 14/613,775

(22) Filed: Feb. 4, 2015

(65) Prior Publication Data

US 2015/0170918 A1    Jun. 18, 2015

Related U.S. Application Data

(63) Continuation of application No. PCT/JP2013/067255, filed on Jun. 24, 2013.

(30) Foreign Application Priority Data

Aug. 8, 2012  (JP) ................ 2012-176435

(51) Int. Cl.
*H01L 21/425* (2006.01)
*H01L 21/268* (2006.01)
(Continued)

(52) U.S. Cl.
CPC ...... *H01L 21/268* (2013.01); *H01L 21/02686* (2013.01); *H01L 21/265* (2013.01);
(Continued)

(58) Field of Classification Search
CPC ............ H01L 21/268; H01L 21/02686; H01L 21/265; H01L 21/324; H01L 29/36; H01L 29/66348; H01L 29/7397; H01L 21/26513
(Continued)

(56) References Cited

U.S. PATENT DOCUMENTS

| | | |
|---|---|---|
| 7,326,630 B2 * | 2/2008 | Tanaka ............... B23K 26/0604 219/121.73 |
| 2005/0059263 A1 | 3/2005 | Nakazawa et al. |

(Continued)

FOREIGN PATENT DOCUMENTS

| | | |
|---|---|---|
| CN | 101256948 A | 9/2008 |
| CN | 102668039 A | 9/2012 |

(Continued)

OTHER PUBLICATIONS

Taiwanese Office Action dated Mar. 24, 2015 corresponding to Taiwanese Patent Application No. 10420369590.

(Continued)

*Primary Examiner* — Xinning Niu
*Assistant Examiner* — Vu A Vu
(74) *Attorney, Agent, or Firm* — Squire Patton Boggs (US) LLP

(57) ABSTRACT

A first laser pulse emitted from a semiconductor laser oscillator and having a first pulse width is entered onto a second surface of a semiconductor substrate in which a semiconductor device is formed on a first surface and dopants are added to a surface layer portion on the second surface side. A second laser pulse having a second pulse width less than or equal to $1/10$ of the first pulse width is entered on an incident area of the first laser pulse in an overlapping manner. The relative positional relationship on a time axis between falling time of the first laser pulse and rising time of the first laser pulse is set such that the temperature of the first surface, which rises due to the incidence of the first laser pulse and the second laser pulse, does not exceed an allowable upper limit value which is predetermined.

9 Claims, 10 Drawing Sheets

(51) Int. Cl.
    *H01L 29/36*     (2006.01)
    *H01L 29/66*     (2006.01)
    *H01L 29/739*     (2006.01)
    *H01L 21/265*     (2006.01)
    *H01L 21/02*     (2006.01)
    *H01L 21/324*     (2006.01)

(52) U.S. Cl.
    CPC ............ *H01L 21/324* (2013.01); *H01L 29/36* (2013.01); *H01L 29/66348* (2013.01); *H01L 29/7397* (2013.01); *H01L 21/26513* (2013.01)

(58) Field of Classification Search
    USPC ........................................................ 438/530
    See application file for complete search history.

(56) References Cited

U.S. PATENT DOCUMENTS

| | | | |
|---|---|---|---|
| 2005/0218122 A1 | 10/2005 | Yamamoto et al. | |
| 2008/0227277 A1 | 9/2008 | Nakazawa | |
| 2009/0227121 A1 | 9/2009 | Matsuno et al. | |
| 2012/0234810 A1* | 9/2012 | Kudo ................... | H01L 21/268 219/121.85 |

FOREIGN PATENT DOCUMENTS

| | | |
|---|---|---|
| DE | 10-2004-030268 A1 | 1/2005 |
| DE | 11-2006-002027 T5 | 6/2008 |
| DE | 10-2008-003953 A1 | 9/2008 |
| DE | 11-2010-004232 T5 | 10/2012 |
| EP | 2674967 A1 | 12/2013 |
| EP | 2674968 A2 | 12/2013 |
| JP | 2005-136218 A | 5/2005 |
| JP | 2005-223301 A | 8/2005 |
| JP | 2007-123300 A | 5/2007 |
| JP | 4117020 B2 | 7/2008 |
| JP | 2008-244446 A | 10/2008 |
| JP | 2009-032858 A | 2/2009 |
| JP | 2010-171057 A | 8/2010 |
| JP | 2011-119297 A | 6/2011 |
| JP | 2012-044121 A | 3/2012 |
| JP | 2014192277 A | 10/2014 |
| KR | 10-2008-0015149 A | 2/2008 |
| KR | 10-2012-0080255 A | 7/2012 |
| WO | WO 2005/099957 A2 | 10/2005 |
| WO | WO 2007/015388 A1 | 2/2007 |
| WO | WO 2011/065094 A1 | 6/2011 |
| WO | WO 2012/026294 A1 | 3/2012 |

OTHER PUBLICATIONS

International Search Report dated Sep. 24, 2013 corresponding to International Patent Application No. PCT/JP2013/067255 and English translation thereof.
Supplemental European Search Report dated Apr. 12, 2016, issued in corresponding European Patent Application No. 13827989.8.

* cited by examiner

OVERLAP RATE=Wo/Wt

Fig.7A
AFTER P-IMPLANTATION
100 keV
2 X 10$^{15}$ cm$^{-2}$
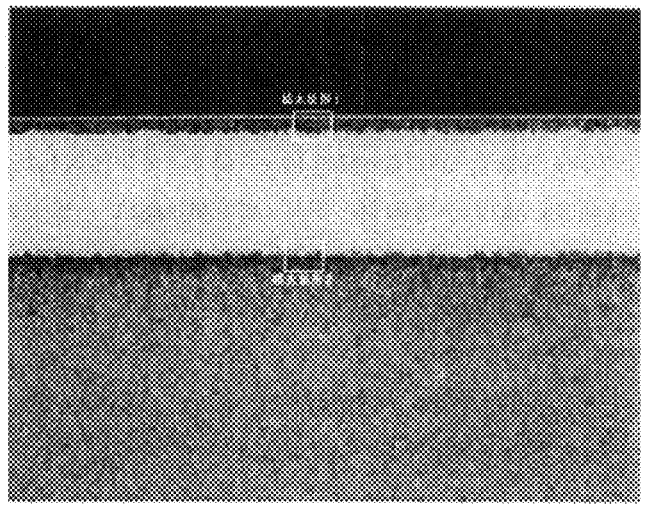
Fig.7B
AFTER ANNEALING BY LP2
PULSE ENERGY DENSITY:
1.6 J/cm$^2$
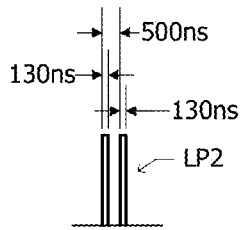
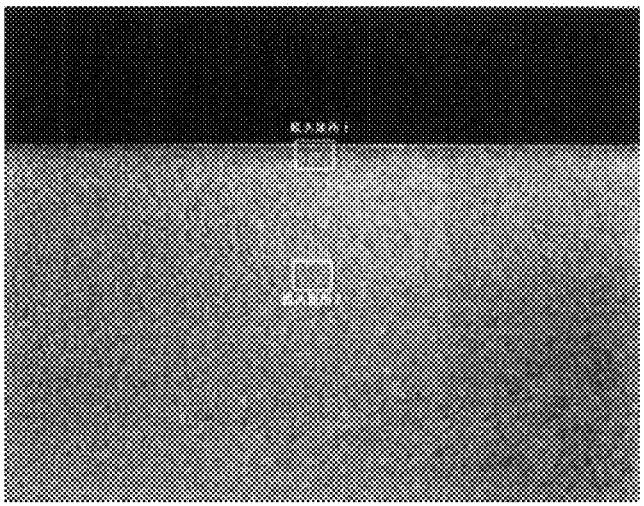
Fig.7C
AFTER ANNEALING BY LP1
POWER DENSITY: 300 kW/cm$^2$
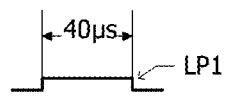
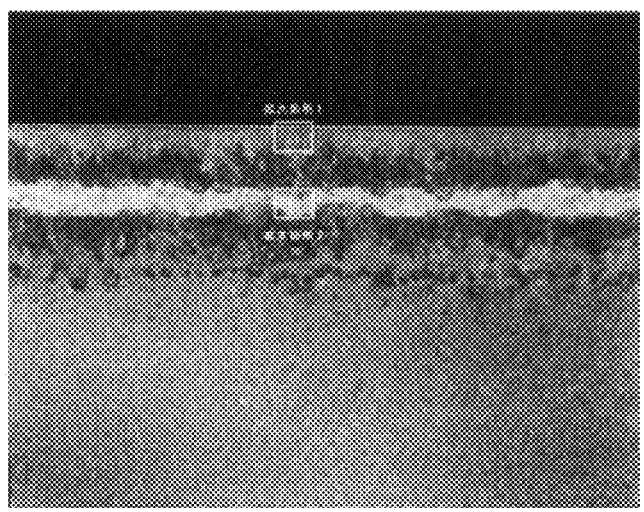

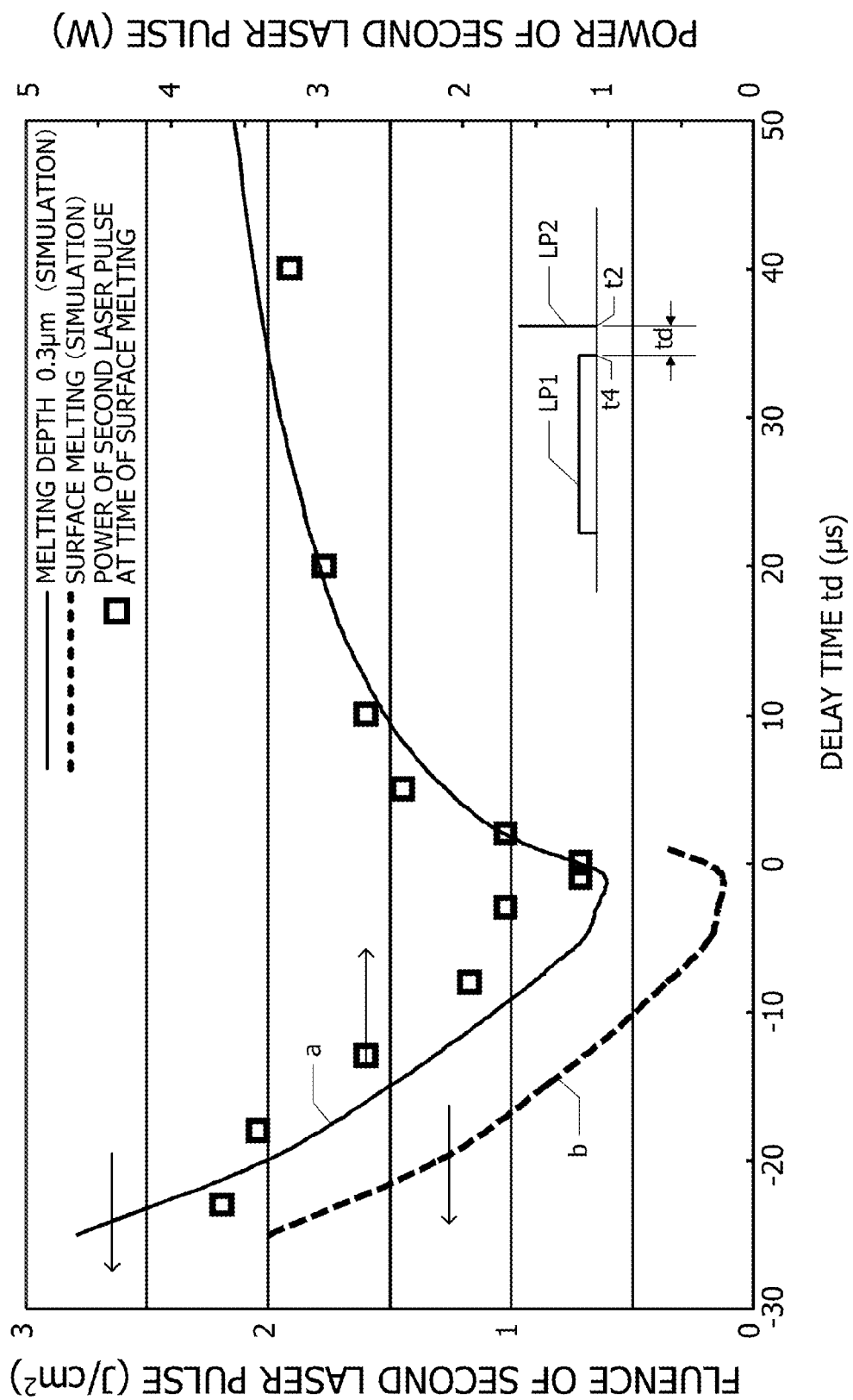

SEMICONDUCTOR DEVICE PRODUCING METHOD

RELATED APPLICATIONS

Priority is claimed to Japanese Patent Application No. 2012-176435, filed Aug. 8, 2012, and International Patent Application No. PCT/JP2013/067255, the entire content of each of which is incorporated herein by reference.

BACKGROUND

Technical Field

The present invention relates to a semiconductor device producing method in which dopants implanted into a semiconductor substrate are activated by the irradiation with a laser beam.

Related Art

Japanese Unexamined Patent Application Publication No. 2010-171057 (PTL1) discloses a semiconductor device producing method in which an electrode layer and a field stop layer are formed by introducing dopants into a semiconductor substrate by ion implantation and then activating the dopants by the irradiation with a laser beam. In the technique described in PTL 1, after a surface structure of a semiconductor device is fabricated, the substrate is thinned. Thereafter, ion implantation is performed on a rear surface and the rear surface is irradiated with pulsed laser beams by using two laser oscillators. A temporal difference between laser pulses which are emitted from the two laser oscillators is set to be less than or equal to 600 ns.

Specifically, for example, phosphorus ions are ion-implanted into a field stop layer formation planned portion from the rear surface side of an n⁻ type silicon substrate. At this time, a dose amount is set to be less than or equal to $1\times10^{14}$ cm$^{-2}$ such that the field stop layer has peak concentration of less than or equal to $5\times10^{18}$ cm$^{-3}$. Subsequently, for example, boron ions and phosphorus ions are respectively implanted into a p⁺ type collector layer formation planned portion and an n⁺ type cathode layer formation planned portion with a dose amount set to be less than or equal to $5\times10^{16}$ cm$^{-2}$ such that the a p⁺ type collector layer and an n⁺ type cathode layer have peak concentration of less than or equal to $1\times10^{21}$ cm$^{-3}$.

It is known that the n⁺ type cathode layer or the like in which ions are implanted at such high concentration is amorphized due to breaking of the crystallinity of the silicon substrate. In the semiconductor device producing method described in PTL 1, defect recovery by solid-phase diffusion and the activation of the dopants implanted into a deep portion exceeding a depth of 1 μm from a laser irradiated surface (the rear surface of the substrate) are performed using the laser irradiation. However, sufficient temperature rise and heating time cannot be secured, and thus the activation of the dopants may be insufficient. If the pulse energy density of the laser beam which is input is increased in order to sufficiently perform the activation of the deep portion, a melting depth becomes deep. If melting is made to the deep portion, dopant concentration distribution in a depth direction changes, and thus characteristics as designed cannot be obtained in some cases. In addition, a problem occurs such as the roughness of the substrate surface becoming worse.

A technique of performing laser annealing by emitting a pulsed laser beam at a pulse energy density in the range in which a semiconductor substrate is not melted is proposed (refer to Japanese Unexamined Patent Application Publication No. 2009-32858, for example). In this method, dopants are ion-implanted at high concentration, and thus it is difficult to sufficiently recover the crystallinity of an amorphized portion and sufficiently activate the implanted dopants.

SUMMARY

According to an aspect of the present invention, there is provided a semiconductor device producing method including:

entering a first laser pulse emitted from a semiconductor laser oscillator and having a first pulse width onto a second surface of a semiconductor substrate in which a semiconductor device is formed on a first surface and dopants are added to a surface layer portion on the second surface side; and entering a second laser pulse having a second pulse width less than or equal to ¹⁄₁₀ of the first pulse width on an incident area of the first laser pulse in an overlapping manner, wherein a relative positional relationship on a time axis between falling time of the first laser pulse and rising time of the first laser pulse is set such that a temperature of the first surface, which rises due to incidence of the first laser pulse and the second laser pulse, does not exceed an allowable upper limit value which is predetermined.

BRIEF DESCRIPTION OF DRAWINGS

FIG. 7A is a cross-sectional TEM image of a surface layer portion of the silicon wafer in which phosphorus is ion-implanted, FIG. 7B is a cross-sectional TEM image of the surface layer portion of the silicon wafer after the irradiation with the second laser pulse, and FIG. 7C is a cross-sectional TEM image of the surface layer portion of the silicon wafer after the irradiation with the first laser pulse.

FIG. 9 is a graph showing the relationship between elapsed time (delay time) from falling time of the first laser pulse to rising time of the second laser pulse, and fluence of the second laser pulse necessary for melting the silicon wafer.

DETAILED DESCRIPTION

In the above mentioned related art, at the point in time when the dopants implanted into the rear surface of the semiconductor substrate are activated, the surface structure of the semiconductor device is already formed on the front side. If the laser irradiation for the activation of the dopants and the recovery of the crystallinity is performed on the rear surface, the temperature of the front side also rises. A significant rise in the temperature of the front side causes damage to the surface structure already formed.

It is desirable to provide a semiconductor device producing method in which when performing activation of dopants by irradiating a surface on one side with a laser, it is possible to suppress a rise in the temperature of a surface on the opposite side.

Figure 1:
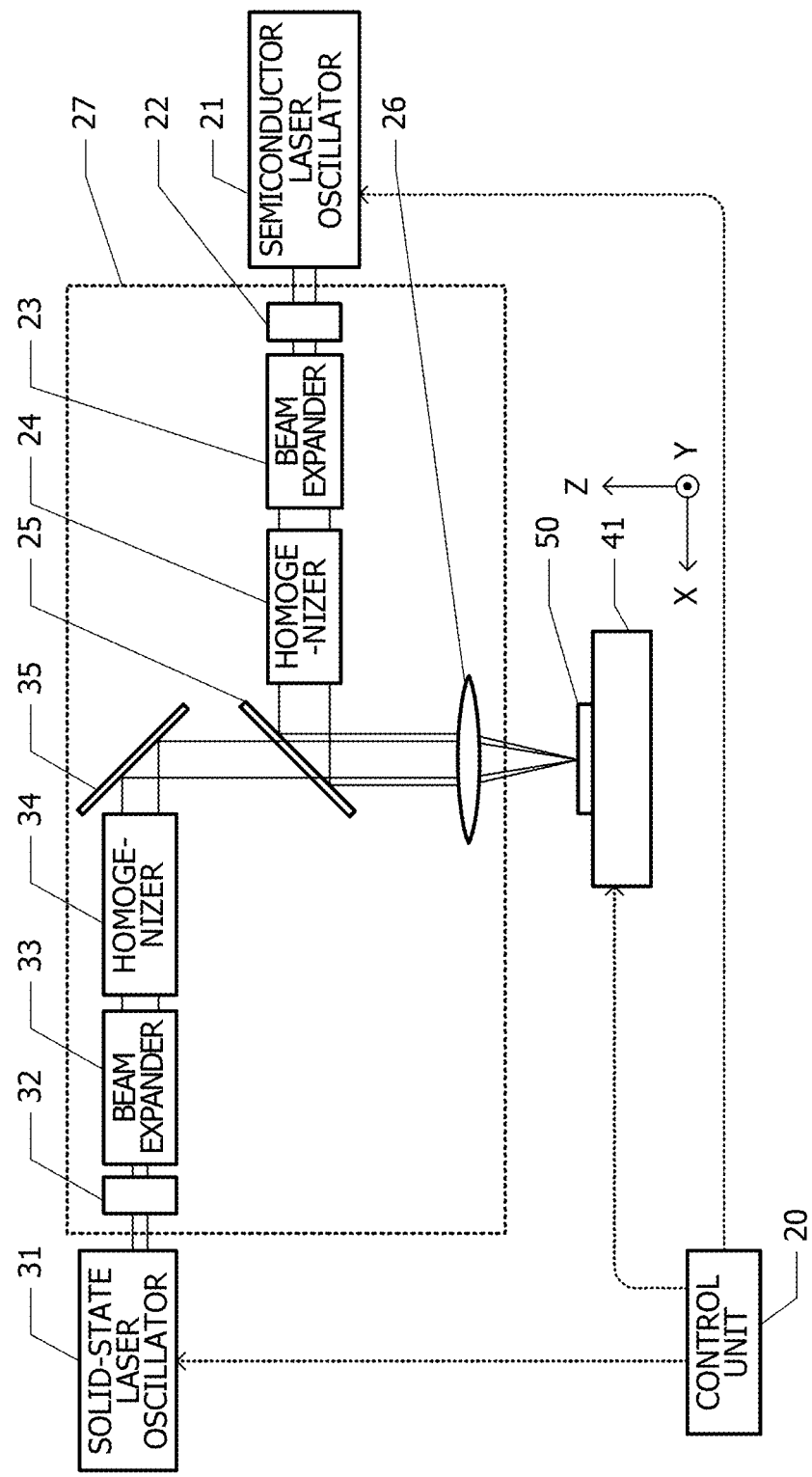
FIG. 1 is a schematic diagram of a laser annealing apparatus which is used in a semiconductor device producing method according to an embodiment.

In FIG. 1, a schematic diagram of a laser annealing apparatus which is used in a semiconductor device producing method according to an embodiment is shown. A semiconductor laser oscillator (a first laser oscillator) 21 emits, for example, a quasi-continuous wave (QCW) laser beam having a wavelength of 808 nm. A semiconductor laser oscillator which emits a pulsed laser beam having a wavelength of less than or equal to 950 nm may be used. A solid-state laser oscillator (a second laser oscillator) 31 emits a pulsed laser beam having a green wavelength region. For example, an Nd:YAG laser, an Nd:YLF laser, an Nd:YVO$_4$ laser, or the like which emits a second harmonic is used for the solid-state laser oscillator 31.

A pulsed laser beam emitted from the semiconductor laser oscillator 21 and a pulsed laser beam emitted from the solid-state laser oscillator 31 are entered onto a semiconductor substrate 50 which is an annealing target, by way of a propagation optical system 27. The pulsed laser beam emitted from the semiconductor laser oscillator 21 and the pulsed laser beam emitted from the solid-state laser oscillator are entered on the same area of the surface of the semiconductor substrate 50.

Next, the configuration and the operation of the propagation optical system 27 will be described. The pulsed laser beam emitted from the semiconductor laser oscillator 21 is incident on the semiconductor substrate 50 by way of an attenuator 22, a beam expander 23, a homogenizer 24, a dichroic mirror 25, and a condensing lens 26.

The pulsed laser beam emitted from the solid-state laser oscillator 31 is incident on the semiconductor substrate 50 by way of an attenuator 32, a beam expander 33, a homogenizer 34, a bending mirror 35, the dichroic mirror 25, and the condensing lens 26.

The beam expanders 23 and 33 collimate the pulsed laser beams having been incident thereon and expand the diameters of the beams. The homogenizers 24 and 34 and the condensing lens 26 shape a beam cross-section on the surface of the semiconductor substrate 50 into an elongated shape and uniformize light intensity distribution in the beam cross-section. The pulsed laser beam emitted from the semiconductor laser oscillator 21 and the pulsed laser beam emitted from the solid-state laser oscillator 31 are incident on substantially the same elongated area on the surface of the semiconductor substrate 50.

The semiconductor substrate 50 is held on a stage 41. An XYZ orthogonal coordinate system is defined in which a plane parallel to the surface of the semiconductor substrate 50 is set to be an X-Y plane and a direction normal to the surface of the semiconductor substrate 50 is set to be a Z direction. A control unit 20 controls the semiconductor laser oscillator 21, the solid-state laser oscillator 31, and the stage 41. The stage 41 moves the semiconductor substrate 50 in an X direction and a Y direction in response to the control from the control unit 20.

Figure 2A:
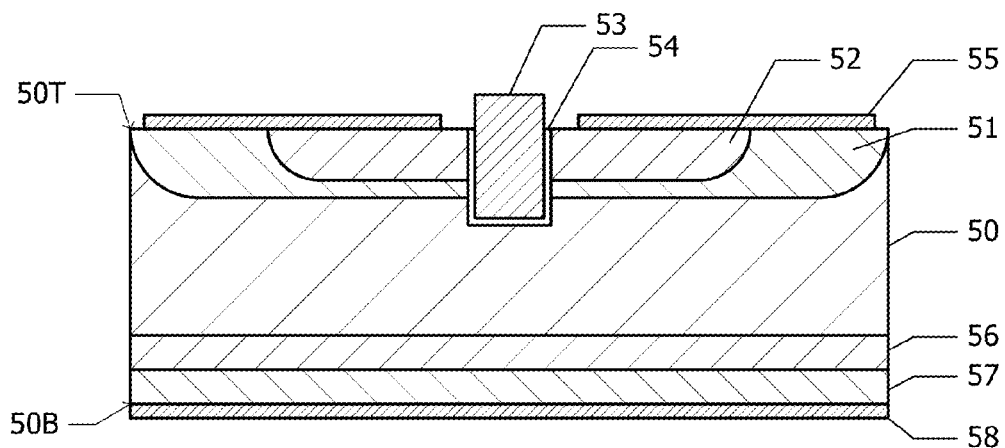
FIG. 2A is a cross-sectional view of an IGBT which is produced by the method according to the embodiment.

In FIG. 2A, a cross-sectional view of an insulated gate bipolar transistor (IGBT) as an example of a semiconductor device which is produced by the method according to the embodiment is shown. The IGBT is fabricated by forming an emitter and a gate on a surface on one side (hereinafter referred to as a "first surface") 50T of the semiconductor substrate 50 made of n-type silicon and forming a collector on a surface on the other side (hereinafter referred to as a "second surface") 50B. As the semiconductor substrate 50, a silicon single crystal substrate is usually used. A structure of the surface on which the emitter and the gate are formed is made by the same process as a manufacturing process of a general MOSFET. For example, as shown in FIG. 2A, a p-type base region 51, an n-type emitter region 52, a gate electrode 53, a gate insulating film 54, and an emitter electrode 55 are disposed at a surface layer portion of the first surface 50T of the semiconductor substrate 50. It is possible to perform ON-OFF control of an electric current by a voltage between the gate and the emitter.

A p-type collector layer 57 and a low-concentration n-type buffer layer 56 are disposed at a surface layer portion of the second surface 50B of the semiconductor substrate 50. The buffer layer 56 is disposed at a position deeper than the collector layer 57. The collector layer 57 and the buffer layer 56 are respectively formed by ion-implanting, for example, boron and phosphorus as dopants and performing activation annealing. The laser annealing apparatus shown in FIG. 1 is applied to the activation annealing. A collector electrode 58 is formed on the surface of the collector layer 57 after the activation annealing.

The depth from the second surface 50B to the interface between the collector layer 57 and the buffer layer 56 is, for example, about 0.3 μm. The depth from the second surface to the deepest position of the buffer layer 56 is within a range of 1 μm to 5 μm, for example.

Figure 2B:
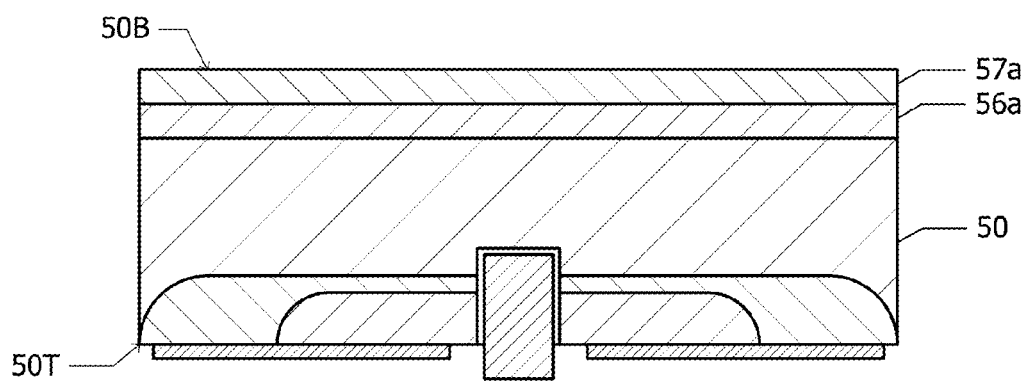
FIG. 2B is a cross-sectional view at a step during the production of the IGBT.

In FIG. 2B, a cross-sectional view of the semiconductor substrate 50 at a step of performing laser annealing is shown. Boron is ion-implanted into a surface layer portion 57a of the second surface 50B of the semiconductor substrate 50. Phosphorus is ion-implanted into a portion 56a deeper than the surface layer portion 57a. The boron in the surface layer portion 57a and the phosphorus in the deep portion 56a have not been activated. Boron concentration of the surface layer portion 57a is higher than phosphorus concentration of the deep portion 56a. In this specification, the surface layer portion 57a is referred to as a "high-concentration layer" and the deep portion 56a is referred to as a "low-concentration layer". Since the dose amount of boron is high, the high-concentration layer 57a is in an amorphous state. A portion deeper than the interface between the high-concentration layer 57a and the low-concentration layer 56a remains in a single-crystal state. The device structure shown in FIG. 2A has been formed on the first surface 50T of the semiconductor substrate 50.

Figure 3A:
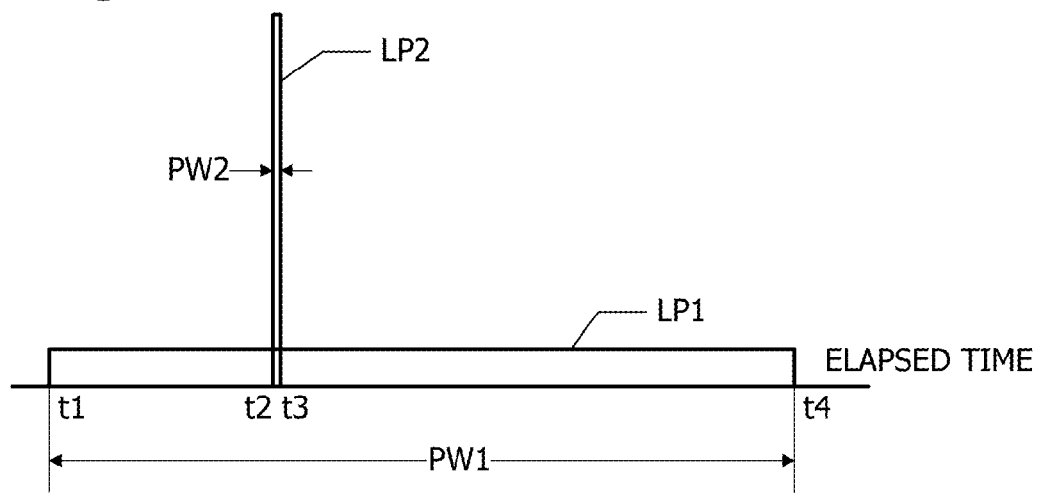
FIG. 3A is a graph showing an example of temporal waveforms of first and second laser pulses which are emitted in the method according to the embodiment.

In FIG. 3A, laser pulse waveforms which are incident on the semiconductor substrate 50 (FIG. 2B) are schematically shown. In FIG. 3A, the pulse waveforms are shown in a rectangular shape. However, the actual pulse waveform includes portions such as rising, attenuation, and falling of a pulse. Emitting timings of the pulse waveforms shown in FIG. 3A are determined by the control unit 20 (FIG. 1) controlling the semiconductor laser oscillator 21 and the solid-state laser oscillator 31.

At time t1, incidence of a first laser pulse LP1 emitted from the semiconductor laser oscillator 21 on the semiconductor substrate 50 is started. At time t2 after the time t1, a second laser pulse LP2 emitted from the solid-state laser oscillator 31 is incident on the semiconductor substrate 50. Areas on which the first laser pulse LP1 and the second laser pulse LP2 are incident approximately overlap. The peak power of the second laser pulse LP2 is higher than the peak power of the first laser pulse LP1 and a pulse width PW2 of the second laser pulse LP2 is shorter than a pulse width PW1 of the first laser pulse LP1. At time t3, the incidence of the second laser pulse LP2 is ended. Thereafter, at time t4, the incidence of the first laser pulse LP1 is ended. Alternatively, the second laser pulse LP2 may be incident after the time t4.

The pulse width PW1 of the first laser pulse LP1 is greater than or equal to, for example, 10 μs. The pulse width PW2 of the second laser pulse LP2 is less than or equal to, for example, 1 μs. As an example, the pulse width PW1 is within a range of 10 μs to 30 μs and the pulse width PW2 is within a range of 100 ns to 200 ns. It is preferable to set the pulse width PW2 of the second laser pulse LP2 to be less than or equal to 1/10 of the pulse width PW1 of the first laser pulse LP1.

Figure 3B:
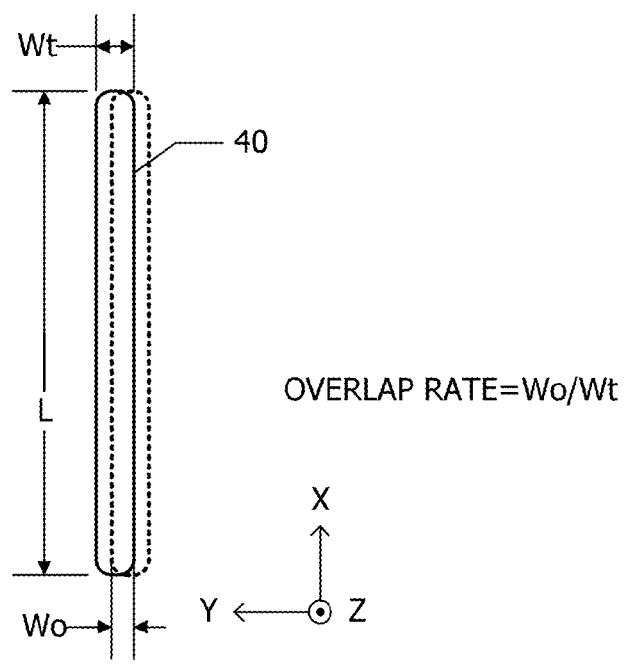
FIG. 3B is a plan view of an incident area of laser pulses.

In FIG. 3B, a plan view of an incident area of a laser pulse on the second surface 50B of the semiconductor substrate 50 (FIG. 2B) is shown. The first laser pulse LP1 (FIG. 3A) and the second laser pulse LP2 (FIG. 3A) are incident on the same beam incident area 40 which is long in the X direction, on the second surface 50B (FIG. 2B) of the semiconductor substrate 50. For example, suitable length L and width Wt of the beam incident area 40 respectively are in a range of 2 mm to 4 mm and a range of 200 μm to 400 μm.

During annealing, the first laser pulse LP1 and the second laser pulse LP2 (FIG. 3A) are caused to be incident on the semiconductor substrate 50 at a certain repetition frequency while moving the semiconductor substrate 50 (FIG. 2B) in the Y direction. A distance that the semiconductor substrate 50 moves during one cycle of the repetition frequencies of the first laser pulse LP1 and the second laser pulse LP2 is represented by Wo. The beam incident areas 40 of the two first laser pulses LP1 adjacent to each other on a time axis partially overlap each other. An overlap rate Wo/Wt of the two is, for example, 50%.

When the incidence of the first laser pulse LP1 is started at the time t1 shown in FIG. 3A, the temperature of the surface layer portion of the second surface 50B (FIG. 2B) of the semiconductor substrate 50 begins to rise. At the point in time of the time t2, the temperature of the second surface 50B of the semiconductor substrate 50 does not reach the melting point (in a range of 1300 K to 1430 K) of amorphous silicon. When the second laser pulse LP2 is caused to be incident at the time t2, the temperature of the surface layer portion of the second surface 50B of the semiconductor substrate 50 reaches the melting point of the amorphous silicon, and thus the surface layer portion is melted. The melted portion reaches the bottom of the high-concentration layer 57a (FIG. 2B).

After the incidence of the second laser pulse LP2 is ended, the temperature of the surface layer portion of the semiconductor substrate 50 is lowered and solidification occurs. At this time, a crystal epitaxially grows from the single-crystalline low-concentration layer 56a (FIG. 2B), whereby the high-concentration layer 57a becomes a single crystal. At the same time, the dopants implanted into the high-concentration layer 57a are activated.

Also at the time t3 or later, the incidence of the first laser pulse LP1 (FIG. 3A) is continued, and therefore, a portion from the second surface 50B of the semiconductor substrate 50 to the deep low-concentration layer 56a is heated, and thus a temperature rises. In this way, the dopants implanted into the low-concentration layer 56a (FIG. 2B) are activated. At the point in time when the incidence of the first laser pulse LP1 is ended at the time t4, the temperature of the second surface 50B of the semiconductor substrate 50 does not reach the melting point of single-crystal silicon. For this reason, the surface layer portion of the second surface 50B of the semiconductor substrate 50 having been recrystallized is not re-melted.

In a case of causing the second laser pulse LP2 to be incident later than the time t4, the dopants in the low-concentration layer 56a are activate by the irradiation with the first laser pulse LP1. Thereafter, the high-concentration layer 57a (FIG. 2B) is melted by the irradiation with the second laser pulse LP2. When the high-concentration layer 57a is recrystallized, the dopants in the high-concentration layer 57a are activated.

Figure 4:
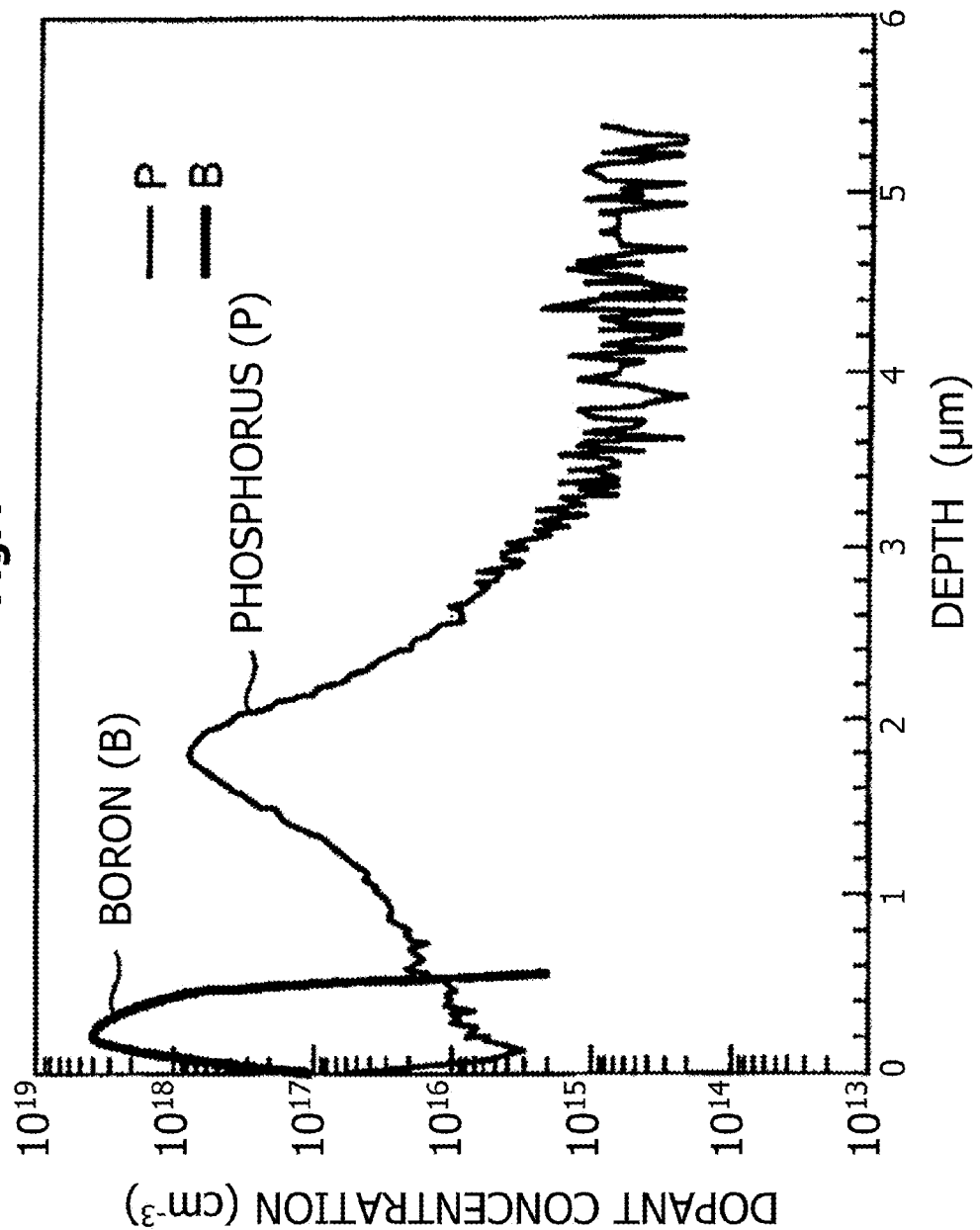
FIG. 4 is a graph showing an example of dopant concentration distribution in a depth direction of a semiconductor substrate.

In FIG. 4, an example of dopant concentration distribution in a depth direction of the semiconductor substrate 50 is shown. A horizontal axis of FIG. 4 represents a depth from the second surface 50B (FIG. 2B) of the semiconductor substrate 50 in a unit of "μm". A vertical axis of FIG. 4 represents the concentration of added dopants in a unit of "$cm^{-3}$" and by a logarithmic scale.

The concentration of boron (B) shows the maximum value at a depth of 0.3 μm from the second surface 50B. Further, the concentration of phosphorus (P) shows the maximum value at a depth of 1.8 μm from the second surface 50B. A foot (a tail) of the concentration distribution of phosphorus (P) extends to a depth of 3 μm from the second surface 50B. A depth where the dopant concentration of boron and the dopant concentration of phosphorus become equal to each other is equivalent to the interface between the high-concentration layer 57a and the low-concentration layer 56a (FIG. 2B).

The dopants (phosphorus) added to a relatively deep portion, a depth of which exceeds, for example, 1 μm, at relatively low concentration are activated by the first laser pulse LP1 (FIG. 3A) having a relatively long pulse width. The dopants (boron) added to a relatively shallow area, a depth of which is, for example, less than or equal to 1 μm, at relatively high concentration are activated by the second laser pulse LP2 (FIG. 3A) having a relatively short pulse width. The second laser pulse LP2 melts the semiconductor substrate 50 to a position deeper than a portion amorphized due to the ion implantation of the dopants at high concentration. The semiconductor substrate 50 in the incident area 40 (FIG. 3B) is melted by the irradiation with the second laser pulse LP2. When the melted area is solidified, liquid phase epitaxial growth occurs from a single-crystalline portion. In this way, the recrystallization of the amorphized portion and the activation of the dopants (boron) are performed.

In FIGS. 2A, 2B, and 4, an example is shown in which boron is implanted into the high-concentration layer 57a which is relatively shallow and phosphorus is implanted into the low-concentration layer 56a which is relatively deep. Also in a case of implanting other dopants, the same activation is performed. Further, dopants of the same conductivity type may be implanted into the high-concentration layer 57a and the low-concentration layer 56a. As an example, phosphorus may be implanted into both the high-concentration layer 57a and the low-concentration layer 56a. In this case, a high-concentration n-type layer is formed at a shallow portion and a low-concentration n-type layer is formed at a deep portion.

The activation of the dopants of the deep low-concentration layer 56a (FIG. 2B) by the irradiation with the first laser pulse LP1 (FIG. 3A) will be described with reference to FIGS. 5 and 6.

Figure 5:
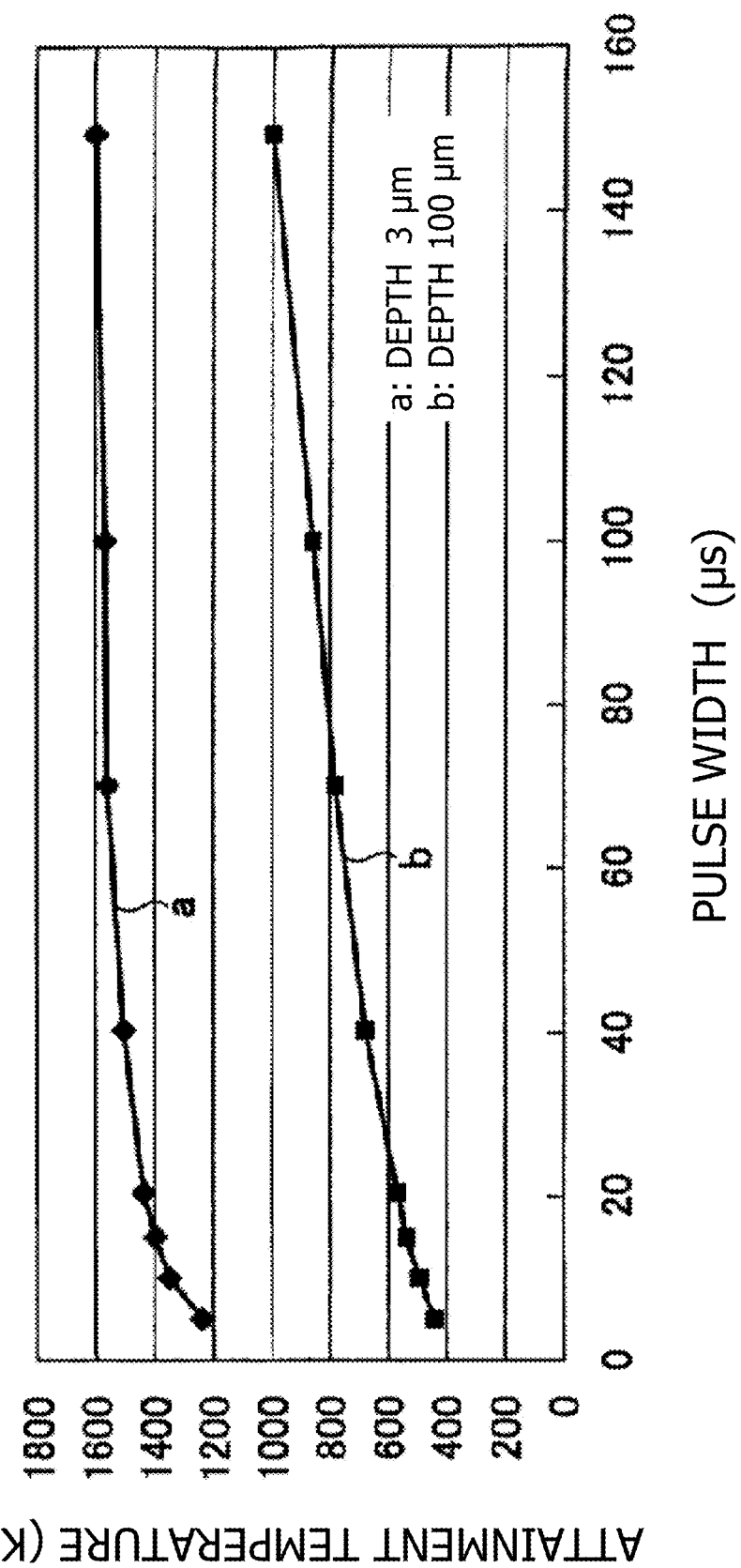
FIG. 5 is a graph showing the simulation results of the relationship between an attainment temperature of a silicon wafer when the silicon wafer is irradiated with the first laser pulse and a pulse width.

In FIG. 5, the simulation results of the relationship between an attainment temperature of a silicon wafer when the silicon wafer is irradiated with the first laser pulse LP1 and a pulse width is shown. A horizontal axis represents the pulse width PW1 of the first laser pulse LP1 in a unit of "μs" and a vertical axis represents an attainment temperature in a unit of "K". The wavelength of the first laser pulse LP1 is set to be 915 nm. The irradiation condition of the first laser pulse LP1 is set to be the condition that the surface temperature of the silicon wafer reaches the melting point (about 1690 K) of silicon. Solid lines a and b of FIG. 5 respectively show attainment temperatures at positions of depths of 3 μm and 100 μm from the surface of the silicon wafer.

It is found that if the pulse width is short, heat is not easily transmitted to a deep area. In order to activate the dopants at a depth position of 3 μm, it is preferable to set the pulse width to be greater than or equal to 5 μs. If the pulse width is too long, the temperature of a deep portion having a depth of about 100 μm, that is, the first surface 50T (FIG. 2B) on which a device structure is formed is increased.

Figure 6:
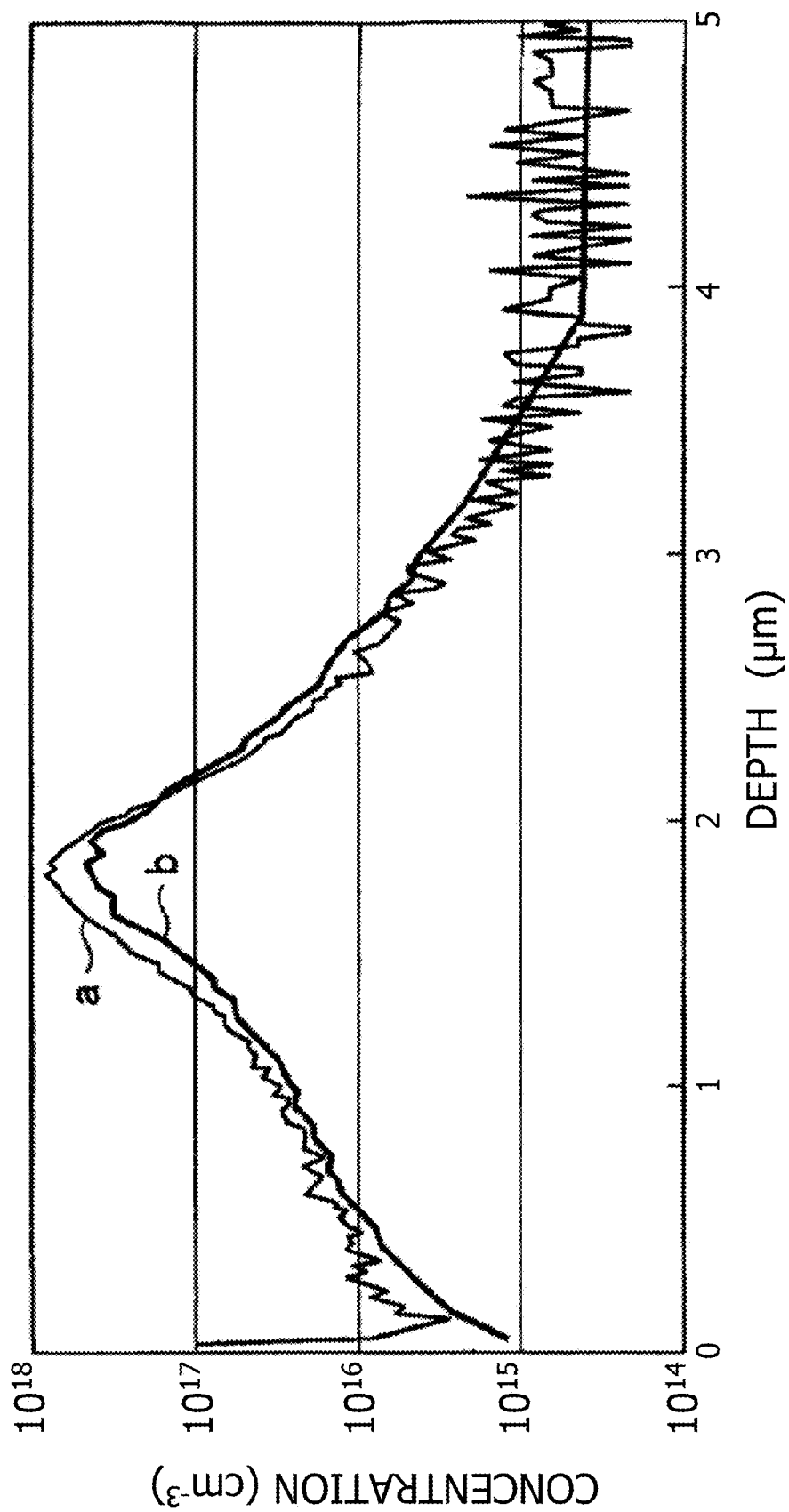
FIG. 6 is a graph showing dopant concentration distribution in the depth direction and carrier concentration distribution after annealing.

In FIG. 6, dopant concentration distribution in the depth direction and carrier concentration distribution after annealing are shown. A horizontal axis represents a depth from the surface of the silicon wafer in a unit of "μm" and a vertical axis represents concentration in a unit of "cm$^{-3}$". A solid line a shows the phosphorus concentration of when ion implantation of phosphorus is performed under the condition that acceleration energy is 2 MeV and a dose amount is $3 \times 10^{13}$ cm$^{-2}$. This dopant concentration distribution corresponds to the dopant concentration distribution of the low-concentration layer 56a (FIG. 2B). A solid line b shows carrier concentration after the first laser pulse LP1 is emitted. The laser irradiation is performed under the condition that a pulse width is 20 μs and power density on an irradiated surface is 360 kW/cm$^2$. From the results shown in FIG. 6, it is confirmed that about 70% or more of the implanted dopants is activated.

Next, the recovery of a portion amorphized by ion implantation will be described with reference to FIGS. 7A to 7C.

In FIG. 7A, a cross-sectional TEM image of a surface layer portion of the silicon wafer in which phosphorus is ion-implanted is shown. The ion implantation of phosphorus is performed under the condition that acceleration energy is 100 keV and a dose amount is $2 \times 10^{15}$ cm$^{-2}$. The conditions of the ion implantation correspond to the ion implantation conditions of dopants into the high-concentration layer 57a. In FIG. 7A, an amorphized portion is represented by a relatively light color.

In FIG. 7B, a cross-sectional TEM image of the surface layer portion of the silicon wafer after the irradiation with the second laser pulse LP2 (FIG. 3A) is shown. As the second laser pulse LP2, the second harmonic of an Nd:YLF laser is used. The irradiation with the second laser pulse LP2 is performed by a so-called double pulse method. The pulse width of one laser pulse is 130 ns, pulse energy density is 1.6 J/cm$^2$, and delay time from the irradiation with the laser pulse of the first shot to the irradiation with the laser pulse of the second shot is 500 ns. In a portion melted by laser irradiation, epitaxial growth occurs from a single-crystal portion below the melted portion, and therefore, a good single crystal layer with few defects is obtained.

In FIG. 7C, a cross-sectional TEM image of the surface layer portion of the silicon wafer after the irradiation with the first laser pulse LP1 (FIG. 3A) is shown. The wavelength of the first laser pulse LP1 is 808 nm. The irradiation with the first laser pulse LP1 is performed under the condition that a pulse width is 40 μs and power density is 300 kW/cm$^2$. Under the irradiation conditions, the surface of the silicon wafer is not melted. If melting is made to a deep portion (the low-concentration layer 56a of FIG. 2B) of the silicon wafer by a laser pulse, the dopant concentration distribution of the high-concentration layer 57a collapses. For this reason, the irradiation with the first laser pulse LP1 is performed under the condition that the silicon wafer is not melted. An annealing method of performing activation of dopants without melting a silicon wafer is referred to as "non-melting annealing". In contrast, an annealing method of temporarily melting a silicon wafer is referred to as "melting annealing". In the non-melting annealing, crystallization proceeds from the upper side and the lower side of an amorphized portion. A layer in an amorphous state remains approximately at the center with respect to a thickness direction. The crystal quality of a crystallized portion is also worse than the crystal quality of a recrystallized portion of FIG. 7B.

As can be seen from the cross-sectional TEM images shown in FIGS. 7A to 7C, in the high-concentration layer 57a (FIG. 2B) in an amorphous state, it is preferable to activate dopants by performing melting annealing by using the second laser pulse LP2 (FIG. 3A) in which the pulse width is relatively short and the peak power is relatively high.

Figure 8A:
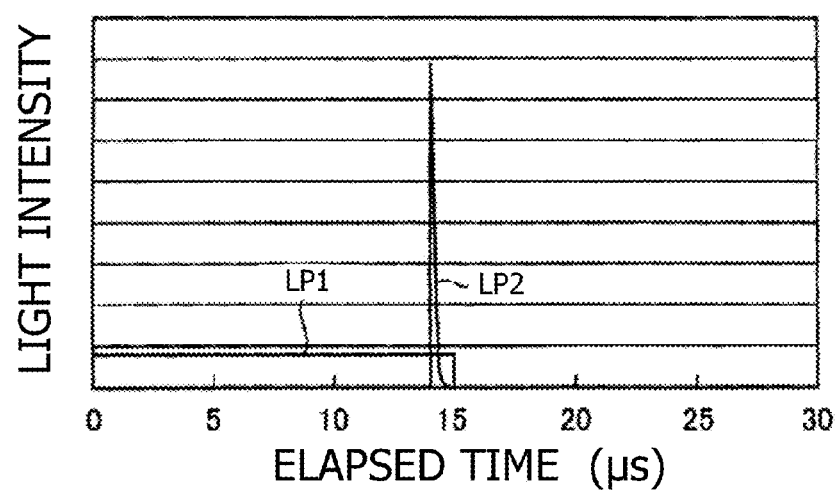
FIG. 8A is a graph showing an example of temporal waveforms of laser pulses when laser annealing is performed in the method according to the embodiment.

In FIG. 8A, an example of temporal waveforms of laser pulses when laser annealing is performed in the method according to the embodiment is shown. A horizontal axis represents elapsed time from rising of the first laser pulse LP1 in a unit of "μs" and a vertical axis represents light intensity. The pulse width of the first laser pulse LP1 is 15 μs. At the point in time when 14 μs has elapsed from the rising of the first laser pulse LP1, the second laser pulse LP2 rises. The second laser pulse LP2 is the second harmonic of an Nd:YLF laser and the pulse width thereof is 130 ns.

Figure 8B:
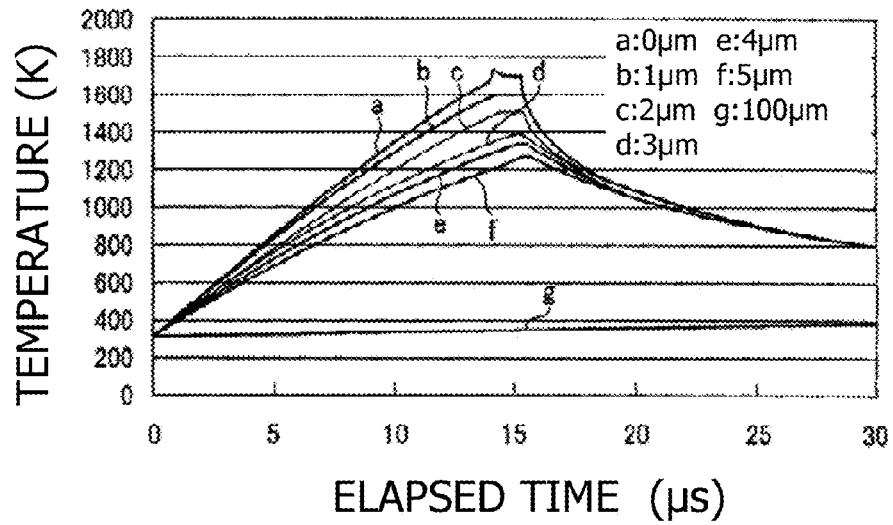
FIG. 8B is a graph showing the simulation results of a temperature change of the silicon wafer when the silicon wafer is irradiated with the first and second laser pulses of FIG. 8A.

In FIG. 8B, the simulation results of a temperature change of the silicon wafer when the silicon wafer is irradiated with the first and second laser pulses LP1 and LP2 of FIG. 8A are shown. A horizontal axis represents elapsed time in a unit of "μs" and a vertical axis represents a temperature in a unit of "K". Solid lines a to g in FIG. 8B respectively show temperatures of the positions where a depth from the surface of the silicon wafer is 0 μm, 1 μm, 2 μm, 3 μm, 4 μm, 5 μm, and 100 μm.

When the irradiation with the first laser pulse LP1 is started, the temperature of the silicon wafer rises. At the point in time when 14 μs has elapsed after the irradiation is started, the surface temperature of the silicon wafer reaches 1660 K close to the melting point of silicon. At this point in time, the silicon wafer has not been melted. When the second laser pulse LP2 is emitted, the surface temperature of the silicon wafer reaches the melting point, and thus the surface layer portion is melted.

Figure 8C:
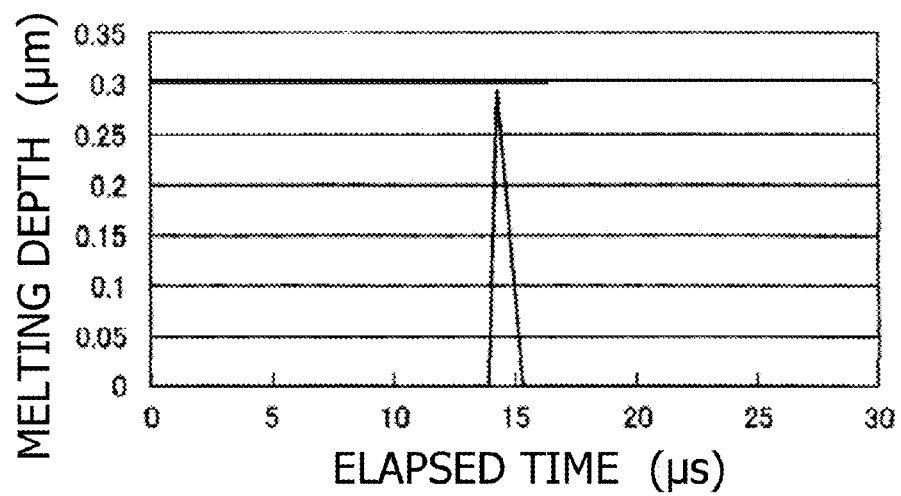
FIG. 8C is a graph showing the simulation results of a temporal change of a melting depth of the silicon wafer.

In FIG. 8C, the simulation results of a temporal change of a melting depth of the silicon wafer are shown. A horizontal axis represents elapsed time in a unit of "μs" and a vertical axis represents a melting depth in a unit of "μm". It is found that melting is made to a depth of about 0.3 μm due to the irradiation with the second laser pulse LP2. The dopants implanted into a portion shallower than the depth of 0.3 μm are activated due to the melting and the recrystallization of the surface layer portion.

As shown in FIG. 8B, at the point in time when about 14 μs has elapsed from the start of the irradiation with the first laser pulse LP1, the temperature of the depth position of 5 μm exceeds 1200 K. For this reason, the dopants implanted into a portion at a depth of about 5 μm, which has not been melted, are activated by solid-phase diffusion. In a case of performing prolonged annealing like annealing by an electric furnace, the activation of dopants begins at a temperature lower than 1200 K. However, in a case of performing heating by a laser pulse having a pulse width which is short in the order of a microsecond, if a temperature exceeds 1200 K, the activation of dopants begins to occur.

In FIG. 9, the relationship between elapsed time t2-t4 from the falling time t4 of the first laser pulse LP1 to the rising time t2 of the second laser pulse LP2 and fluence of the second laser pulse LP2 necessary for melting the silicon wafer is shown. The delay time from the time t4 to the time t2 is denoted by td. A horizontal axis represents the delay time td in a unit of "μs". In a range where the delay time td is negative, the second laser pulse LP2 rises before the falling time t4 of the first laser pulse LP1. The left vertical axis of FIG. 9 represents the fluence of the second laser pulse LP2 in a unit of "J/cm$^2$", and the right vertical axis represents the power of the second laser pulse LP2 in a unit of "W".

A solid line a shown in FIG. 9 indicates the simulation results of the fluence of the second laser pulse LP2 under the condition that the position at a depth of 0.3 μm of the silicon wafer is melted. A broken line b indicates the simulation results of the fluence of the second laser pulse LP2 under the condition that the outermost surface of the silicon wafer is melted. The increase or decrease tendencies of the two when the delay time td changes are approximately equal to each other. A square symbol shown in FIG. 9 indicates an actual measurement value of the power of the second laser pulse LP2 when the outermost surface of the silicon wafer is melted. Since the area of the incident area 40 (FIG. 3B) and the pulse width of the first laser pulse LP1 are constant, by multiplying the power of the second laser pulse LP2 by a constant, it is possible to be converted into fluence. As shown in FIG. 9, the simulation results are sufficiently matched to the actual experimental results.

The origin (td=0) of the horizontal axis corresponds to the irradiation condition that the second laser pulse LP2 rises simultaneously with the falling of the first laser pulse LP1.

The pulse width of the first laser pulse LP1 is set to be 25 μs and the power density on the silicon wafer surface is set to be 310 kW/cm$^2$. A position where the delay time td is −25 μs corresponds to the irradiation condition that the second laser pulse LP2 rises simultaneously with the rising of the first laser pulse LP1.

If the delay time td is increased toward 0 μs from −25 μs (the rising time t2 of the second laser pulse LP2 is brought close to the falling time t4 of the first laser pulse LP1), the fluence of the second laser pulse LP2 necessary for melting the silicon wafer is reduced. This is because the silicon wafer has been preheated by the first laser pulse LP1 at the point in time of the incidence of the second laser pulse LP2. In the vicinity of the delay time td=0, the fluence of the second laser pulse LP2 necessary for melting the silicon wafer shows the minimum value.

The fluence of the second laser pulse LP2 necessary for melting the silicon wafer increases as the delay time td becomes longer from 0. This is because the temperature of the silicon wafer is reduced (a preheating effect is reduced) after the falling time t4 of the first laser pulse LP1.

As can be seen from the simulation results shown in FIG. 9 and the experimental results, by adjusting the irradiation timings with the first laser pulse LP1 and the second laser pulse LP2, it is possible to reduce the fluence of the second laser pulse LP2 necessary for melting the silicon wafer. In other words, if the area of the incident area 40 (FIG. 3B) is constant, as the solid-state laser oscillator 31 (FIG. 1) for the second laser pulse LP2, it is possible to use a solid-state laser oscillator having small output. If the output of the solid-state laser oscillator 31 is constant, it is possible to increase the area of the incident area 40.

Figure 10:
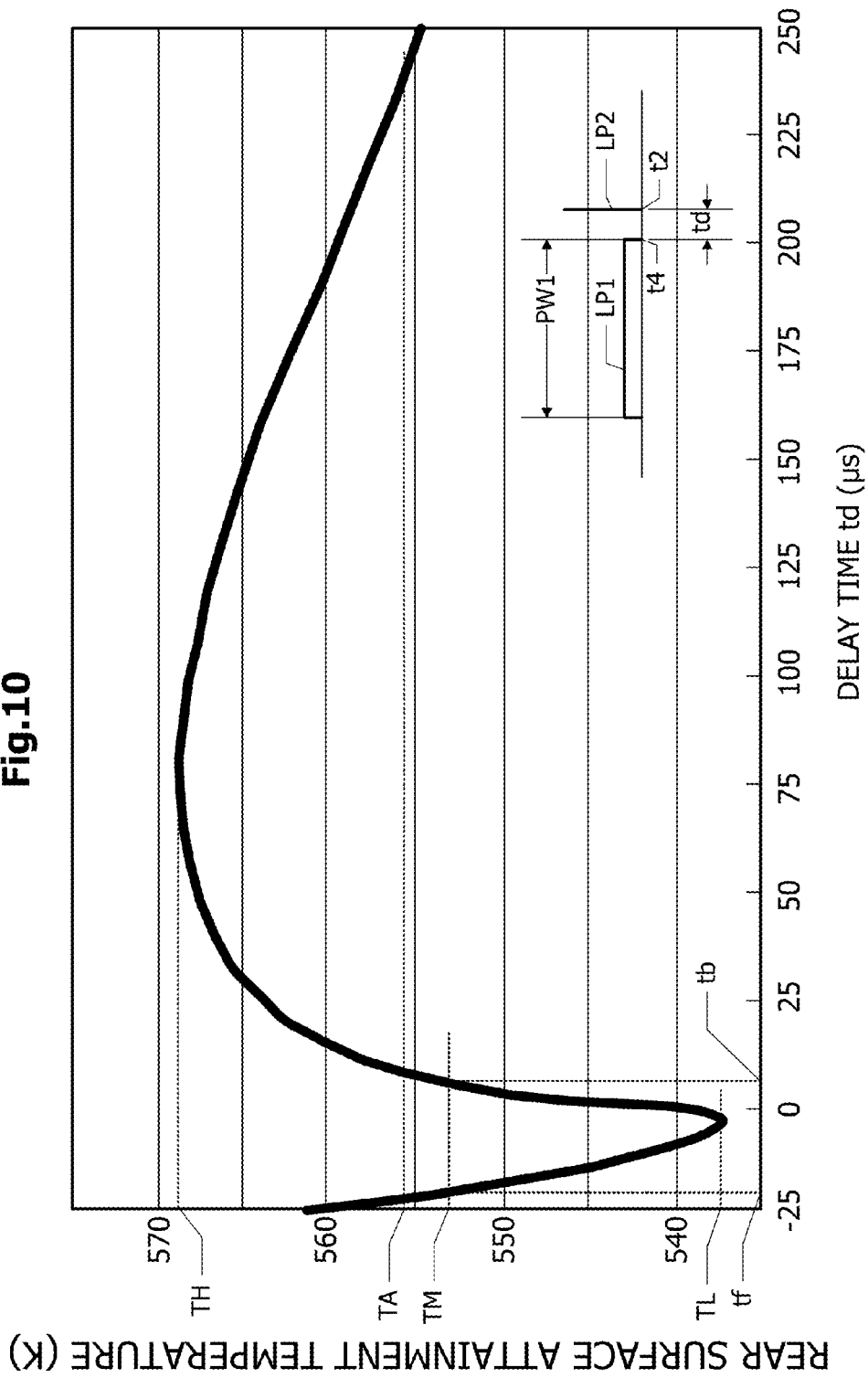
FIG. 10 is a graph showing the simulation results of an attainment temperature of the rear surface when a silicon wafer having a thickness of 100 μm is irradiated with the first laser pulse and the second laser pulse.

In FIG. 10, the simulation results of an attainment temperature of the rear surface when a silicon wafer having a thickness of 100 μm is irradiated with the first laser pulse LP1 and the second laser pulse LP2 are shown. A horizontal axis represents the delay time td in a unit of "μs" and a vertical axis represents the attainment temperature of the rear surface in a unit of "K".

The repetition frequencies of both the first laser pulse LP1 and the second laser pulse LP2 are set to be 2 kHz and the pulse widths of the first laser pulse LP1 and the second laser pulse LP2 are respectively set to be 25 μs and 0.15 μs. The power density of the first laser pulse LP1 is set to be 310 kW/cm$^2$. The fluence of the second laser pulse LP2 is set to be the condition that a portion at a depth of 0.3 μm of the silicon wafer is melted.

The attainment temperature of the rear surface changes depending on the delay time td under the condition that the melting depth becomes a certain depth, 0.3 μm, on the laser irradiated surface. In a case of manufacturing the IGBT, it is not preferable that the attainment temperature of the rear surface become high. The attainment temperature of the rear surface shows the minimum value in the vicinity of the delay time td=0. If the delay time td is made longer than 0, the attainment temperature of the rear surface first shows the maximum value and then gradually decreases. However, as shown in FIG. 9, the fluence of the second laser pulse LP2 has to be increased in order to melt the silicon wafer as the delay time td becomes longer. In order to suppress an increase in the fluence of the second laser pulse LP2, it is preferable that the delay time td be selected from a range which includes the minimum value in the vicinity of the origin. In a case where an allowable upper limit value TA of the attainment temperature of the rear surface is predetermined, in FIG. 10, it is favorable if the delay time td is set such that the attainment temperature of the rear surface becomes less than or equal to the allowable upper limit value TA.

Next, the preferable irradiation conditions for suppressing a rise in rear surface temperature will be described.

A lowest value TL and a highest value TH of the attainment temperature of the rear surface respectively appear in the vicinity of the delay time td of 0 and the vicinity of the delay time td of 75 μs. In order to obtain a sufficient effect of suppressing a rise in the attainment temperature of the rear surface by adjusting the incidence timings of the first laser pulse LP1 and the second laser pulse LP2, it is preferable to set the attainment temperature of the rear surface to be less than or equal to an average value TM of the lowest value TL and the highest value TH.

In the simulation results shown in FIG. 10, the attainment temperature of the rear surface becomes less than or equal to the average value TM. between tf and tb of the delay time td. When the pulse width of the first laser pulse LP1 is denoted by W, approximately, tf is −4W/5 and tb is W/4. That is, it is preferable to adjust the incidence timings of the first laser pulse LP1 and the second laser pulse LP2 such that the elapsed time t2-t4 satisfies a relationship, −4W/5≤t2−t4≤W/4 ... (1). If the pulse width W changes, the irradiation condition (the power density) is set such that a target attainment temperature of the substrate surface at the time of the falling of a pulse becomes substantially constant though the slope of a temperature rise in a period in which the first laser pulse LP1 is emitted changes. For this reason, even in a case of performing activation annealing on the condition that the pulse width W is different, a lower limit value of t2-t4 of the above-described conditional expression (1) can also be applied to the condition that the pulse width W is different.

After the falling of the first laser pulse LP1, that is, a range satisfying a relationship, 0≤t2−t4, the temperature of the substrate surface is reduced with time according to thermal diffusion, and thus a preheating effect is reduced. The thermal diffusion depends on a temperature profile in the depth direction of the substrate. For example, if the pulse width W becomes longer, a temperature rises even at a deeper portion and a temperature profile in the depth direction becomes gentle. When the temperature profile is gentle, a decrease in the surface temperature after the falling of the first laser pulse LP1 also becomes gentle. That is, speed at which the preheating effect is reduced depends on the pulse width W, and if the pulse width W becomes longer, the preheating effect lasts a long time. In the simulation results shown in FIG. 10, the rear surface attainment temperature when the delay time td is W/2 is substantially equal to the rear surface attainment temperature when the delay time td is −25 μs, that is, when it is considered that there is no preheating effect. Therefore, it is considered that the preheating effect of the first laser pulse LP1 is obtained by adjusting the timings of the first laser pulse LP1 and the second laser pulse LP2 so as to satisfy a relationship, t2−t4≤W/2.

Even if the condition such as the pulse width, the melting depth, or the thickness of the silicon wafer when the simulation of FIG. 10 is performed changes, the increase or decrease tendency of the graph shown in FIG. 10 is maintained. Therefore, the above-described conditional expression (1) is not limited to the condition that the simulation is performed.

In the embodiment described above, if the wavelength of the first laser pulse LP1 is set to be too short, laser energy is absorbed at a very shallow portion of the silicon wafer, and thus it becomes difficult to efficiently heat a deep portion. On the contrary, if the wavelength of the first laser pulse LP1 is set to be too long, laser energy is not absorbed into the silicon wafer. In order to efficiently heat the low-concentration layer 56a (FIG. 2B) of the silicon wafer by the first laser pulse LP1, it is preferable to set the wavelength thereof to be greater than or equal to 550 nm and less than or equal to 950 nm.

Light having a wavelength of 550 nm penetrates to a depth of about 1 μm of a silicon substrate. For this reason, if the wavelength of the first laser pulse LP1 is set to be 550 nm, it is possible to efficiently heat a portion to a depth of 1 μm. A portion deeper than the depth of 1 μm is heated by heat conduction. If the wavelength of the first laser pulse LP1 is set to be 650 nm, it is possible to efficiently heat a portion to a depth of about 3 μm. If the wavelength of the first laser pulse LP1 is set to be 700 nm, it is possible to efficiently heat a portion to a depth of about 5 μm. In a case where the thickness of the silicon substrate is 100 μm, if the wavelength of the first laser pulse LP1 is set to be longer than 950 nm, laser energy transmitting through the silicon substrate increases.

In order to activate the dopants of the low-concentration layer 56a (FIG. 2B) which is deep, it is preferable to set a light penetration depth of the first laser pulse LP1 into the semiconductor substrate 50 to be longer than a depth from the second surface 50B of the semiconductor substrate 50 to the bottom of the low-concentration layer 56a. Further, in order to reduce wasted light energy transmitting through the semiconductor substrate 50, it is preferable to set the light penetration depth of the first laser pulse LP1 to be shorter than the thickness of the semiconductor substrate 50. The wavelength of the first laser pulse LP1 is selected so as to satisfy the above-described light penetration depth. Here, the "light penetration depth" means a distance that light intensity is attenuated to 1/e.

It is preferable that the irradiation conditions with the first laser pulse LP1, specifically, the pulse width and the power density be set to be the conditions that the surface of the semiconductor substrate is not melted and the activation of the dopants in the low-concentration layer 56a begins. Specifically, it is preferable to set the irradiation condition to be the condition that the temperature of the bottom of the low-concentration layer 56a exceeds 1200 K.

It is preferable that the second laser pulse LP2 include a green wavelength component which is easily absorbed into silicon, in order to efficiently melt the high-concentration layer 57a (FIG. 2B) of the silicon wafer. In addition, because of the preheating effect of the first laser pulse LP1, light having a wavelength longer than that of green light is also easily absorbed into silicon. Therefore, the wavelength of the second laser pulse LP2 may be set to be an infrared region having a wavelength of about 1 μm. Since light having a wavelength of an infrared region penetrates to a deep portion of the silicon substrate, the light melts the silicon substrate to a deeper portion, compared to a case of using light having a green wavelength region as the second laser pulse LP2.

In the embodiment described above, the manufacturing of the IGBT has been taken as an example. In addition, the method according to the above-described embodiment can be applied to the manufacturing of a semiconductor device in which it is desired to activate the dopants of a surface layer portion of the surface on one side of a semiconductor substrate and suppress a rise in temperature of the surface on the opposite side.

It should be understood that the invention is not limited to the above-described embodiment, but may be modified into various forms on the basis of the spirit of the invention. Additionally, the modifications are included in the scope of the invention.

REFERENCE SIGNS LIST

20: control unit
21: semiconductor laser oscillator
22: attenuator
23: beam expander
24: homogenizer
25: dichroic mirror 26: condensing lens
27: propagation optical system
31: solid-state laser oscillator
32: attenuator
33: beam expander
34: homogenizer
35: bending mirror
40: incident area of laser pulse
41: stage
50: semiconductor substrate
50T: first surface
50B: second surface
51: p-type base region
52: n-type emitter region
53: gate electrode
54: gate insulating film
55: emitter electrode
56: low-concentration n-type buffer layer
56a: low-concentration layer
57: p-type collector layer
57a: high-concentration layer
58: collector electrode

What is claimed is:

1. A semiconductor device producing method comprising:
    entering a first laser pulse emitted from a semiconductor laser oscillator and having a first pulse width onto a second surface of a semiconductor substrate in which a semiconductor device is formed on a first surface, first dopants are added to a portion shallower than a first depth in a surface layer portion on the second surface side at a first concentration, and second dopants are added to a portion deeper than the first depth in the surface layer portion on the second surface side at second concentration lower than the first concentration; and
    entering a second laser pulse having a second pulse width less than or equal to 1/10 of the first pulse width in such a manner that an incident area of the second laser pulse is overlapped with an incident area of the first laser pulse,
    wherein a relative positional relationship on a time axis between falling time of the first laser pulse and rising time of the second laser pulse is set such that a temperature of the first surface, which rises due to incidence of the first laser pulse and the second laser pulse, does not exceed an allowable upper limit value which is predetermined, and
    wherein the first laser pulse is entered onto the second surface under a condition that the second dopants are able to be activated without the second laser pulse,
    wherein when the falling time of the first laser pulse is denoted by t4, rising time of the second laser pulse is denoted by t2, and the first pulse width is denoted by W, a relationship, $-4W/5 \leq t2-t4 \leq W/2$, is satisfied.

2. The semiconductor device producing method according to claim 1, wherein the portion shallower than the first depth in the surface layer portion on the second surface side of the semiconductor substrate is amorphized by implanting the first dopants, and
    melting and crystallization of the portion shallower than the first depth occur due to the incidence of the second laser pulse, whereby the first dopants are activated, and the second dopants are activated in a solid-phase state.

3. The semiconductor device producing method according to claim 2, wherein a laser light source of the second laser pulse is a solid-state laser oscillator which emits a second harmonic.

4. The semiconductor device producing method according to claim 2, wherein a wavelength of the first laser pulse is selected such that a light penetration depth into the semiconductor substrate is deeper than a depth from the second surface to a bottom of a portion in which the second dopants are implanted.

5. The semiconductor device producing method according to claim 2, wherein a wavelength of the first laser pulse is selected such that a light penetration depth into the semiconductor substrate is shallower than a thickness of the semiconductor substrate.

6. The semiconductor device producing method according to claim 1, wherein the portion shallower than the first depth in the surface layer portion on the second surface side of the semiconductor substrate is amorphized by implanting the first dopants, and
    melting and crystallization of the portion shallower than the first depth occur due to the incidence of the second laser pulse, whereby the first dopants are activated, and the second dopants are activated in a solid-phase state.

7. The semiconductor device producing method according to claim 3, wherein a wavelength of the first laser pulse is selected such that a light penetration depth into the semiconductor substrate is deeper than a depth from the second surface to a bottom of a portion in which the second dopants are implanted.

8. The semiconductor device producing method according to claim 3, wherein a wavelength of the first laser pulse is selected such that a light penetration depth into the semiconductor substrate is shallower than a thickness of the semiconductor substrate.

9. The semiconductor device producing method according to claim 4, wherein a wavelength of the first laser pulse is selected such that a light penetration depth into the semiconductor substrate is shallower than a thickness of the semiconductor substrate.

* * * * *